(12) United States Patent
Nguyen

(10) Patent No.: US 6,472,261 B2
(45) Date of Patent: *Oct. 29, 2002

(54) METHOD OF FORMING AN INTEGRATED CIRCUIT CONTACT STRUCTURE HAVING GATE ELECTRODE PROTECTION FOR SELF-ALIGNED CONTACTS WITH ZERO ENCLOSURE

(75) Inventor: Loi N. Nguyen, Carollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 22 days.

This patent is subject to a terminal disclaimer.

(21) Appl. No.: 09/270,609

(22) Filed: Mar. 17, 1999

(65) Prior Publication Data

US 2002/0000627 A1 Jan. 3, 2002

Related U.S. Application Data

(62) Division of application No. 08/885,642, filed on Jun. 30, 1997, now Pat. No. 6,057,604, which is a continuation-in-part of application No. 08/639,316, filed on Apr. 24, 1996, now Pat. No. 5,793,114, which is a continuation of application No. 08/392,061, filed on Feb. 22, 1995, now abandoned, which is a division of application No. 08/169,587, filed on Dec. 17, 1993, now Pat. No. 5,439,846.

(51) Int. Cl.[7] .................. H01L 21/8238; H01L 21/336; H01L 21/3205; H01L 21/44
(52) U.S. Cl. .............. 438/230; 438/233; 438/303; 438/586; 438/672; 438/675
(58) Field of Search .............. 438/230, 233, 438/303, 586, 672, 675; 29/871

(56) References Cited

U.S. PATENT DOCUMENTS

| 4,292,728 A | 10/1981 | Endo | 29/571 |
| 4,507,171 A | 3/1985 | Bhatia et al. | 156/643 |
| 4,650,543 A * | 3/1987 | Kishita et al. | 156/643 |
| 4,686,000 A | 8/1987 | Heath | 156/643 |
| 4,830,971 A | 5/1989 | Shibata | 437/29 |

(List continued on next page.)

FOREIGN PATENT DOCUMENTS

| EP | 0 477 683 A2 | 4/1992 | H01L/21/82 |
| JP | 1-122139 A | 5/1989 | H01L/21/90 |
| JP | 1-273347 A | 11/1989 | H01L/27/10 |
| JP | 4-49670 A | 2/1992 | H01L/29/784 |
| JP | 5-211131 A | 8/1993 | H01L/21/28 |

OTHER PUBLICATIONS

F.H. Kusters, et al, "Self Aligned Bitline Contact for 4 Mbit DRAM," Extended Abstracts, vol. 87–1, The Electrochem. Soc. 1987, p. 289.

IBM Technical Disclosure Bulletin vol. 32, No. 4A Sep. 1989, p. 344.

"A New Technology for Oxide Contact and Via Etch," Semiconductor International, Aug., 1993, p. 36.

*Primary Examiner*—Jerome Jackson, Jr.
*Assistant Examiner*—Shrinivas H. Rao
(74) *Attorney, Agent, or Firm*—Lisa K. Jorgenson; Daniel E. Venglarik

(57) ABSTRACT

A technique for forming integrated circuit device contacts includes the formation of nitride spacers along side gate electrodes for LDD definition. In addition, a nitride cap layer is formed over the gate electrodes. When a contact opening is formed through the interlevel oxide dielectric, the nitride cap and sidewall spacers protect the gate electrode from damage and shorting. A highly doped poly plug is formed in the opening to make contact to the underlying substrate. Metalization is formed over the poly plug in the usual manner.

16 Claims, 2 Drawing Sheets

U.S. PATENT DOCUMENTS

| | | | |
|---|---|---|---|
| 4,931,845 A | 6/1990 | Ema | 357/71 |
| 4,997,790 A | 3/1991 | Woo et al. | 437/195 |
| 5,057,902 A | 10/1991 | Haskell | 357/71 |
| 5,075,762 A | 12/1991 | Kondo et al. | 357/71 |
| 5,108,945 A * | 4/1992 | Matthews | 437/60 |
| 5,112,761 A * | 5/1992 | Matthews | 437/31 |
| 5,132,237 A * | 7/1992 | Matthews | 437/40 |
| 5,134,083 A * | 7/1992 | Matthews | 437/40 |
| 5,154,946 A * | 10/1992 | Zdebel | 437/34 |
| 5,158,910 A | 10/1992 | Cooper et al. | 437/195 |
| 5,166,771 A | 11/1992 | Godinho et al. | 257/368 |
| 5,171,713 A * | 12/1992 | Matthews | 437/189 |
| 5,182,225 A * | 1/1993 | Matthews | 437/58 |
| 5,206,187 A | 4/1993 | Doan et al. | 437/192 |
| 5,231,055 A | 7/1993 | Smith | 437/192 |
| 5,244,826 A * | 9/1993 | Matthews | 437/44 |
| 5,286,667 A | 2/1994 | Lin et al. | 437/52 |
| 5,290,728 A | 3/1994 | Sato | 437/52 |
| 5,292,677 A * | 3/1994 | Matthews | 437/52 |
| 5,373,678 A | 12/1994 | Hesser | 52/592.1 |
| 5,420,074 A | 5/1995 | Oshima | 437/193 |
| 5,439,846 A | 8/1995 | Nguyen et al. | 437/187 |
| 5,459,354 A | 10/1995 | Hara | 257/754 |
| 5,477,074 A | 12/1995 | Yen | 257/377 |
| 5,519,239 A | 5/1996 | Chu | 257/314 |
| 5,614,756 A | 3/1997 | Forouhi et al. | 257/530 |
| 5,691,561 A | 11/1997 | Goto | 257/369 |
| 5,817,562 A | 10/1998 | Chang et al. | 438/305 |
| 5,920,780 A | 7/1999 | Wu | 438/301 |

\* cited by examiner

METHOD OF FORMING AN INTEGRATED CIRCUIT CONTACT STRUCTURE HAVING GATE ELECTRODE PROTECTION FOR SELF-ALIGNED CONTACTS WITH ZERO ENCLOSURE

CROSS-REFERENCE TO RELATED APPLICATIONS

This application is a division of application Ser. No. 08/885,642, filed Jun. 30, 1997 and issued as U.S. Pat. No. 6,057,604, which is a continuation-in-part of U.S. application Ser. No. 08/639,316, filed Apr. 24, 1996, titled SELF-ALIGNED METHOD FOR FORMING CONTACT WITH ZERO OFFSET TO GATE, issued as U.S. Pat. No. 5,793,114; which is a continuation of U.S. application Ser. No. 08/392,061, filed Feb. 22, 1995, titled SELF-FORMING CONTACT WITH ZERO OFFSET TO GATE, abandoned; which is a divisional of U.S. application Ser. No. 08/169,587, filed Dec. 17, 1993, titled SELF-ALIGNED METHOD FOR FORMING CONTACT WITH ZERO OFFSET TO GATE, issued as U.S. Pat. No. 5,439,846. All of these applications and patents were invented by Loi N. Nguyen, the inventor of the present application, and Robert L. Hodges. All applications and patents are assigned to STMicroelectronics, Inc., the assignees of the present application. The above applications and patents are hereby incorporated by reference in their entirety into the present application.

BACKGROUND OF THE INVENTION

1. Field of the Invention

The present invention relates generally to the fabrication of semiconductor integrated circuit devices, and more specifically to a technique for fabricating contacts with zero offset.

2. Description of the Prior Art

Formation of field effect transistors in integrated circuits often includes the formation of lightly doped drain (LDD) regions adjacent the channel. This minimizes hot-electron effects, and improves operation of the transistor. In order to form these LDD regions using a self-aligned process, a sidewall oxide ($SiO_2$) spacer is formed along side the transistor gate.

When forming the oxide sidewall spacers, it is necessary to over etch the oxide layer from which they are formed in order to insure that all contact areas are completely clear. This over etching also damages field oxide regions, and significant over etch of the field oxide regions can allow implanted dopants to penetrate through the field oxide during later source/drain formation.

Also, it is necessary to insure that substrate contacts are not misaligned so as to extend over the gate electrodes. When this type of misalignment happens, etching required to clear the contact of interlevel oxide can damage the oxide cap and sidewall spacers on the gate. Significant damage of the oxide sidewall spacer can cause a short between the sidewall and gate.

A number of processing approaches have been used to address these and other problems. One approach is to deposit a thick oxide on top of the gate prior to the gate definition etch. This provides some margin, but does not solve the problem of the required enclosure near gate electrodes.

Other approaches use additional poly layers as "landing pads" for contacts in the matrix of DRAM and SRAM devices.

As described in parent application Ser. No. 639,316, which has been incorporated herein to by reference, spacers formed of silicon nitride may be used for LDD definition. These spacers protect the gate from later over etching during contact formation, because silicon nitride and oxide can be highly selectively etched over each other.

As device geometries continue to shrink, contacts are formed which have a very high aspect ratio. This is particularly true between adjacent gate electrodes in a device having regular structure, such as a memory matrix. It is difficult to provide sufficient barrier metal at the bottom of these high aspect ratio openings to provide proper protection for the underlying substrate.

It would therefore be desirable to provide an improved technique for fabricating contacts and semiconductor integrated circuits which addresses and solves the problems described above.

SUMMARY OF THE INVENTION

Therefore, in accordance with the present invention, a technique for forming integrated circuit device contacts includes the formation of nitride spacers along side gate electrodes for LDD definition. In addition, a nitride cap layer is formed over the gate electrodes. When a contact opening is formed through the interlevel oxide dielectric, the nitride cap and sidewall spacers protect the gate electrode from damage and shorting. A highly doped poly plug is formed in the opening to make contact to the underlying substrate. Metalization is formed over the poly plug in the usual manner.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figure representing cross-sections of portions of an integrated circuit during fabrication are not drawn to scale, but instead are drawn so as to illustrate the important features of the invention.

Figure 1:
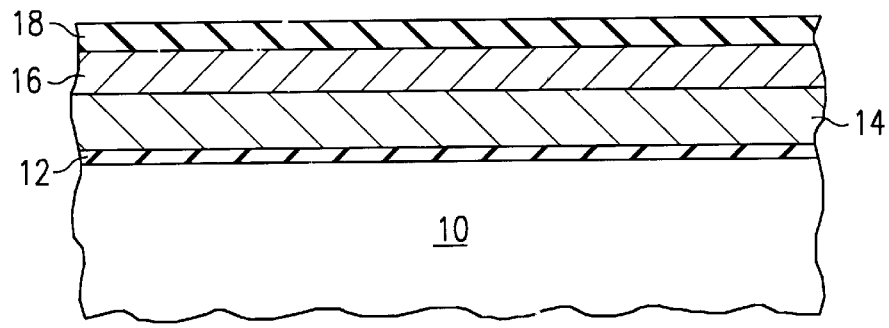
FIGS. 1 through 6 illustrate a preferred method for fabricating semiconductor integrated circuit contacts in accordance with the present invention.
Figure 2:
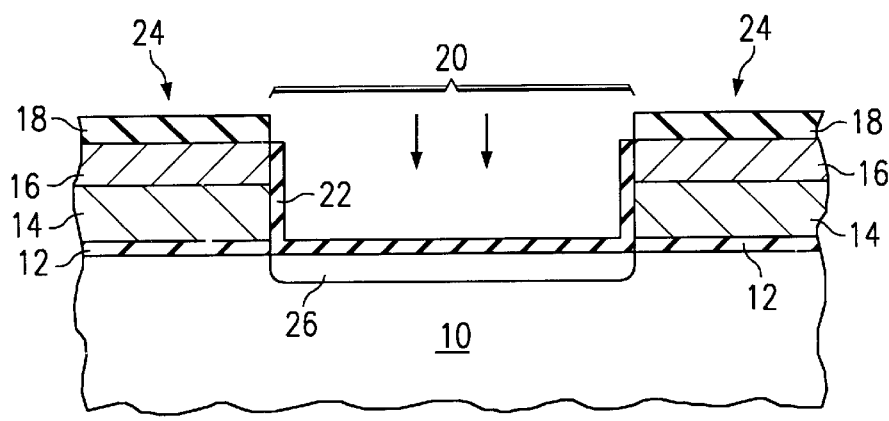

Referring to FIG. 1, a contact is to be formed to a selected portion of integrated circuit substrate 10. On an upper surface of the substrate is formed a gate oxide layer 12, which may be a thermal oxide or ONO layer as known in the art. Polycrystalline silicon layer 14 is deposited over the gate oxide layer 12, and doped to improve conductivity as known in the art. Preferably, a refractory metal silicide layer 16 can be formed over the polycrystalline silicon layer 14 to improve conductivity of the poly layer. Finally, a layer of silicon nitride 18 is deposited,over the refractory metal silicide layer 16.

Using photoresist (not shown) as known in the art, the device is patterned and etched to form an opening 20 through layers 12, 14, 16, 18, and expose a portion of substrate 10. A reoxidation step is performed as known in the art to form a thermal oxide layer 22 on the exposed substrate surface. Oxide layer 22 also forms along side sidewalls of the gate electrodes 24 which were defined by the previous etch step. A dopant implant step is performed to create LDD region 26 between the gate electrodes 24.

Figure 3:
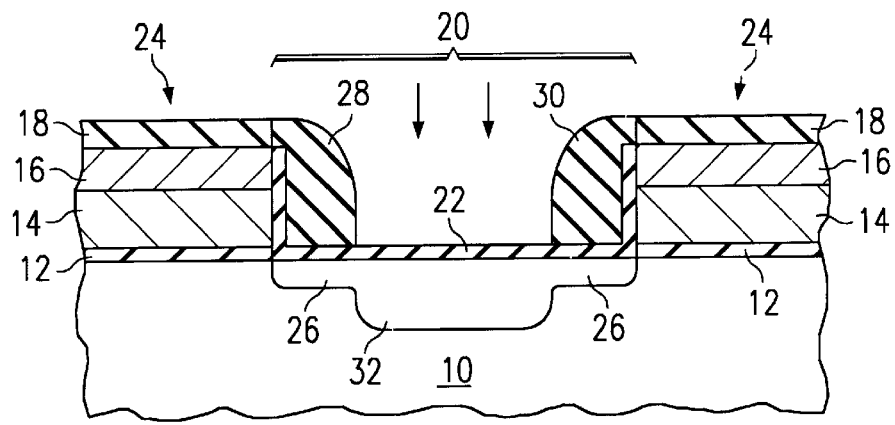

Referring to FIG. 3, nitride sidewall spacers 28, 30 are formed alongside the gate electrodes 24 as known in the art. These spacers are formed by a blanket conformal deposition of silicon nitride, followed by anisotropic etch back to leave sidewall spacers 28, 30. A heavy dopant implant is used to form source/drain region 32, with the sidewall spacers 28, 30 defining LDD regions 26 for the two transistors.

Figure 4:
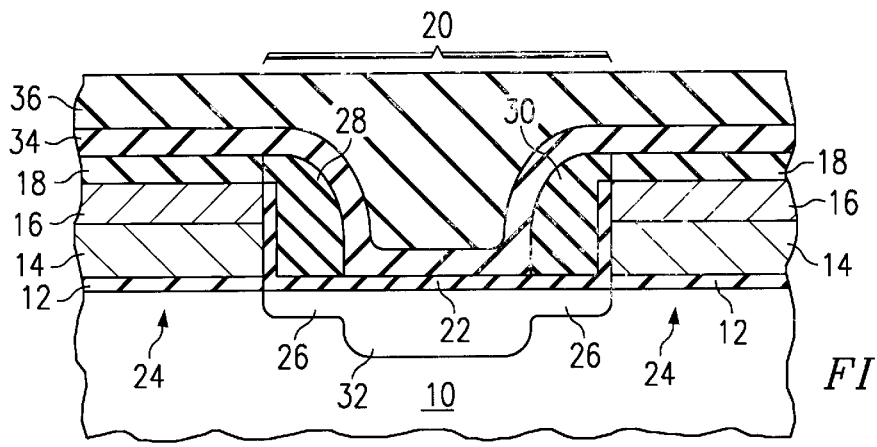

Referring to FIG. 4, the interlevel oxide layer is then formed over the device. In a preferred embodiment, a layer 34 of undoped oxide is conformally deposited over the device, followed by a layer of BPSG, or similar oxide such as SOG. Deposition of SOG, or reflow of a BPSG layer, provides a relatively planar upper surface for layer 36.

Figure 5:
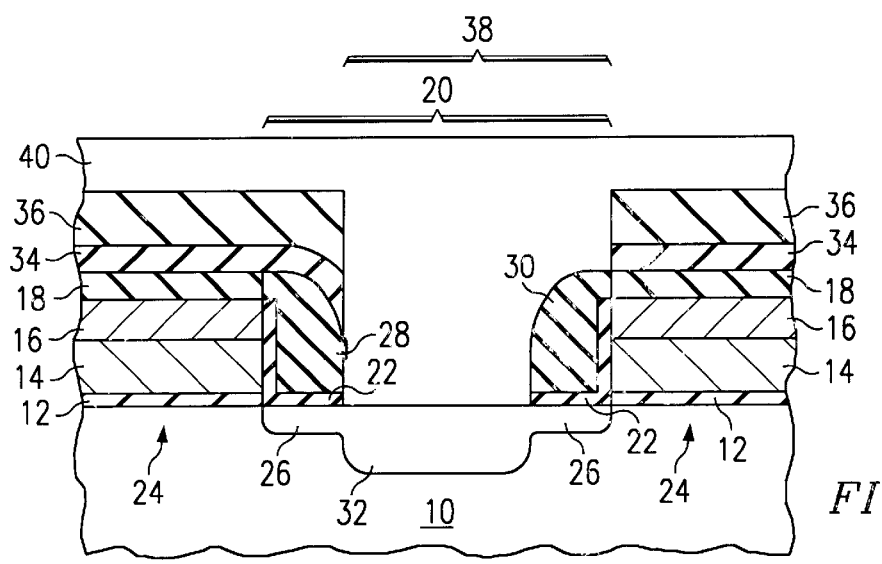

Referring to FIG. 5, an opening 38 is etched through the interlevel oxide to expose portions of the substrate 10. This etch will remove portions of layers 36, 34, and 22. An etch is used which is selective for oxide over nitride, so that the sidewall spacers 28, 30, and the nitride cap layer 18, protects the gate 24 during this step.

In FIG. 5, the opening 38 is misaligned with respect to the contact region with the substrate 10. Ideally, opening 38 would be properly aligned. However, in actual processing it is common for openings to be somewhat misaligned as shown. Because nitride layer 18 and spacers 28, 30 protect the gates 24 during the opening etch step, alignment is not critical during this self-aligned process.

Once opening 38 has been formed, a layer of doped amorphous or polycrystalline silicon 40 is formed over the device. This layer should be formed to a depth sufficient to completely fill all openings such as opening 38, which will typically leave fairly thick portions of layer 40 over regions outside the opening 38.

Figure 6:
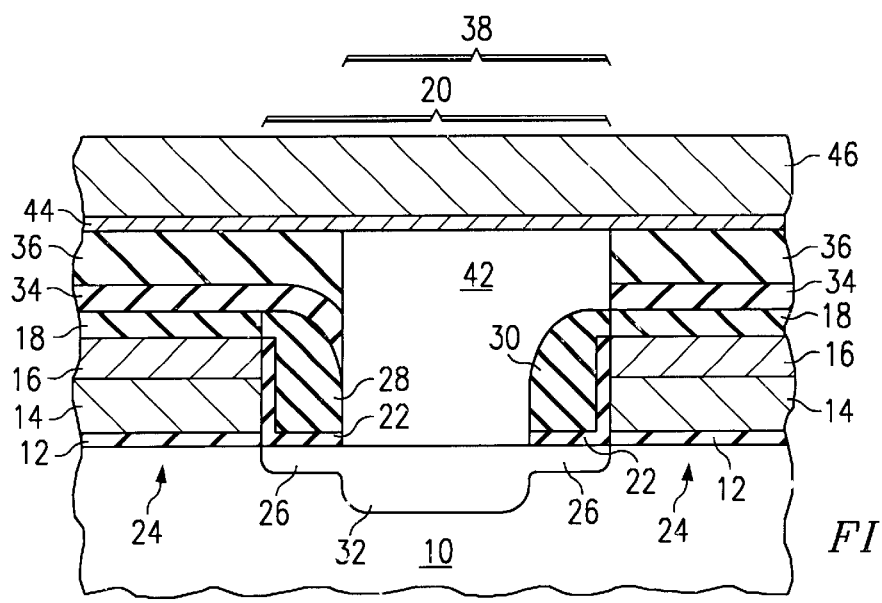

Referring to FIG. 6, polycrystalline silicon layer 40 is etched back, using chemical and mechanical polishing, or other etchback techniques, to form an amorphous or polycrystalline silicon reach-up plug 42. As shown in FIG. 6, plug 42 has an upper surface approximately coplanar with the upper surface of oxide layer 36. In actual practice, plug 42 will usually be etched a little below the surface of oxide layer 36 to ensure that all amorphous or polycrystalline silicon is removed from the surface of layer 36.

A barrier metal layer 44 is formed over the device, followed by aluminum (typically aluminum alloy with small amounts of copper and silicon) layer 46. The barrier layer is typically formed from materials such as titanium and titanium nitride. The metal layer 44 may also be formed from tungsten or another suitable material. Because the upper surface of plug 42 is approximately co-planar with the upper surface of oxide layer 36, the barrier metal layer 44 is formed with 100% coverage. In other words, because the barrier metal layer 44 does not reach down into a relatively deep opening having a high aspect ratio, a good, reliable barrier layer is formed. This remains true even if the layer 40 is overetched somewhat; the upper surface of the plug 42 is close enough to the surface of oxide layer 36 that the problems caused by PVD of a metal into a deep opening do not occur. The high quality of barrier layer 44 on the plug 42 prevents the formation of junction spikes (if the interconnect material is aluminum) or volcanos (if the interconnect material is tungsten).

Although FIG. 6 shows the use of a metal layer over the poly plug 42, this technique can be used with multiple levels of poly/silicide contacts as well.

In a typical embodiment, the following ranges of layer thicknesses and sizes may be used. As will be appreciated by those skilled in the art, these numbers may be modified to suit various processing requirements.

Typically, polycrystalline silicon layer 14 has a thickness of between 1500 and 2000 angstroms, as does silicide layer 16. Typically, the poly layer is a little thicker than silicide layer 16. Silicon nitride layer 18 preferably has a thickness of approximately 1000 angstroms. Layers 16 and 18 are preferably deposited using CVD processing.

The silicon nitride layer which is deposited to form spacers 28, 30 is typically deposited to a thickness of 2000 to 4000 angstroms. Thickness of this layer is determined by the necessary spacer width of the resulting sidewalls. Polycrystalline silicon layer 40 is preferably deposited using a technique such as LPCVD, which generally results in amorphous rather than polycrystalline silicon. Preferably, layer 40 is doped in situ but doping could be done afterward using techniques known in the art.

It will be appreciated by those skilled in the art that materials other than those specified may be used for the sidewall and top cap layers. The sidewalls should have the property that they can be selectively etched over the material used for the interlevel dielectric, and vice versa. Also, depending on the application, materials other than amorphous or polycrystalline silicon could be used to form the reach-up plug in the opening.

When a contact is formed using the technique described above, a superior contact is formed while completely protecting the gate electrodes from damage due to contact opening misalignment. Because the gate is so well protected, zero enclosure designs are possible. Because the material in plug 42 is very highly doped, typically approximately $10^{20}$ atoms/cm$^3$, contact resistance remains low even in cases of fairly significant misalignment.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A method for forming a contact in an integrated circuit device, comprising:
   forming a gate electrode on a substrate surface, the gate electrode having a capping layer of a first material on an upper surface of the gate electrode leaving sides of the electrode exposed;
   forming sidewalls alongside the gate electrode, the sidewalls including:
      a first region of a second material selectively etchable over the first material and formed to a selected thickness on both a side of the gate electrode and the substrate surface adjacent the gate electrode, and
      a second region of the first material on the second material formed on the first region alongside the gate electrode and over the substrate surface, wherein the first region of each sidewall is an L-shaped oxide layer formed by reoxidizing the substrate and the exposed sides of the gate electrode;
  forming an interlevel dielectric layer of the second material over the gate electrode, sidewalls, and substrate;
  etching an opening through the interlevel dielectric layer to expose a portion of the substrate, wherein the gate electrode is protected by the sidewalls and the capping layer;
  forming a conductive plug in the opening in contact with the exposed portion of the substrate by:
    depositing a conductive material over the interlevel dielectric layer and filling the opening; and
    etching back the conductive material to form a plug having an upper surface approximately coplanar with an upper surface of the interlevel dielectric layer; and forming an interconnect over the interlevel dielectric and the conductive plug.

2. The method of claim 1, wherein the conductive plug is formed from polycrystalline silicon.

3. The method of claim 1, wherein the conductive plug is formed from amorphous silicon.

4. The method of claim 1, wherein the interlevel dielectric layer and the first region in the sidewalls are formed from silicon oxide, and the capping layer and the second region in the sidewalls are formed from silicon nitride.

5. The method of claim 1, further comprising:
  before the step of forming the sidewalls, implanting lightly doped drain regions into the substrate; and
  after forming the sidewalls, implanting a heavily doped source/drain region in the substrate adjacent the sidewalls.

6. The method of claim 1, wherein the step of forming an interconnect comprises:
  forming a barrier layer over the interlevel dielectric layer and the conductive plug;
  forming a conductive metal layer over the barrier layer; and
  patterning and etching the conductive metal and barrier layers to define the interconnect.

7. The method of claim 6, wherein the conductive metal layer comprises aluminum.

8. The method of claim 6, wherein the conductive metal layer comprises tungsten.

9. The method of claim 6, wherein the barrier layer comprises titanium.

10. The method of claim 6, wherein the barrier layer comprises titanium nitride.

11. The method of claim 1, wherein the step of forming a gate electrode comprises:
  forming a gate insulator on the substrate;
  forming a polycrystalline silicon layer on the gate insulator;
  forming the capping layer of the first material over the polycrystalline silicon layer; and
  etching the capping layer, the polycrystalline silicon layer, and the gate layer to define the gate electrode.

12. The method of claim 11, further comprising:
  forming a refractory metal silicide layer between the polycrystalline silicon layer and the capping layer, wherein the silicide layer is also etched during the etch employed to define the gate electrode.

13. A method of forming a contact opening, comprising:
  forming a gate electrode on a substrate;
  forming a capping layer of a first material on the gate electrode, wherein the first material is selectively etchable over a second material and the second material is selectively etchable over the first material;
  forming an L-shaped etch stop layer of the second material on sidewalls of the gate electrode and on a surface of the substrate adjacent the gate electrode by reoxidizing the substrate and the exposed sides of the gate electrode;
  forming a layer of the first material over the gate electrode and the surface of the substrate adjacent the gate electrode;
  patterning the layer of the first material;
  etching an opening through the layer of the second material to expose a portion of the substrate, wherein the patterned layer of the first material and a portion of the etch stop layer remaining after etching the opening form a sidewall alongside the gate electrode; and
  forming a conductive plug in the opening in contact with the exposed portion of the substrate by:
    depositing a conductive material over the interlevel dielectric layer and filling the opening; and
    etching back the conductive material to form a plug having an upper surface approximately coplanar with an upper surface of the interlevel dielectric layer.

14. The method of claim 13, wherein the step of forming a layer of the first material over the gate electrode and the surface of the substrate adjacent the gate electrode further comprises:
  forming a conformal nitride layer over the gate electrode and the surface of the substrate adjacent the gate electrode.

15. A method of forming a contact, comprising:
  forming a plurality of gates spaced apart on a substrate, each gate including a nitride capping layer on a polysilicon gate electrode and a gate dielectric, the nitride capping layer leaving sides of the gate electrode and gate dielectric exposed;
  reoxidizing the substrate and the exposed sides of the polysilicon gate electrode to form an L-shaped oxide layer to a selected thickness on both sidewalls of each gate electrode and on a surface of the substrate between the gate electrodes;
  forming nitride sidewall regions alongside the gates and over the oxide layer;
  forming an oxide interlevel dielectric over the gates, the sidewall regions, and the surface of the substrate between the gates;
  etching an opening through the oxide interlevel dielectric and the oxide layer over the surface of the substrate between the gates to expose a portion of the substrate; and
  forming a contact within the opening by:
    depositing a conductive material over the interlevel dielectric layer and filling the opening; and
    etching back the conductive material to form a plug having an upper surface approximately coplanar with an upper surface of the interlevel dielectric layer.

16. The method of claim 15, wherein the step of forming nitride sidewall regions alongside the gates and over the oxide layer further comprises:
  forming a conformal nitride layer over the gates and over the oxide layer; and
  patterning the nitride layer using the oxide layer as an etch stop to form the nitride sidewall regions.

* * * * *